United States Patent [19]

Fava et al.

[11] Patent Number: 5,802,561
[45] Date of Patent: Sep. 1, 1998

[54] SIMULTANEOUS, MIRROR WRITE CACHE

[75] Inventors: Thomas F. Fava, Colorado Springs; Joseph M. Keith, Manitou Springs; Randy R. Fuller, Colorado Springs, all of Colo.

[73] Assignee: Digital Equipment Corporation, Maynard, Mass.

[21] Appl. No.: 671,154

[22] Filed: Jun. 28, 1996

[51] Int. Cl.[6] .................................................. G06F 12/08
[52] U.S. Cl. .................... 711/120; 711/162; 711/129; 711/130; 711/131; 711/168; 711/150; 395/182.04
[58] Field of Search ..................... 711/120, 129, 711/130, 162, 113, 119, 122, 131, 142, 146, 168, 150; 395/182.04, 182.05, 182.03

[56] References Cited

U.S. PATENT DOCUMENTS

| | | | |
|---|---|---|---|
| 5,126,889 | 6/1992 | Walden | 360/53 |
| 5,544,347 | 8/1996 | Yanai et al. | 711/162 |
| 5,640,506 | 6/1997 | Duffy | 395/182.04 |
| 5,640,530 | 6/1997 | Beardsley et al. | 711/113 |
| 5,649,154 | 7/1997 | Kumar et al. | 711/122 |

FOREIGN PATENT DOCUMENTS

8-115257  5/1996  Japan.

*Primary Examiner*—Eddie P. Chan
*Assistant Examiner*—Reginald G. Bragdon
*Attorney, Agent, or Firm*—Ronald C. Hudgens

[57] ABSTRACT

A cache memory system in a computing system has a first cache module storing data, a second cache module storing data, and a controller writing data simultaneously to both the first and second cache modules. A second controller can be added to also write data simultaneously to both the first and second cache modules. In a single write cycle each controller requests access to both the first and second cache modules. Both cache modules send an acknowledgement of the cache request back to the controllers. Each controller in response to the acknowledgements from both of the cache modules simultaneously sends the same data to both cache modules. Both of the cache modules write the same data into cache in their respective cache modules.

10 Claims, 8 Drawing Sheets

SIMULTANEOUS, MIRROR WRITE CACHE

CROSS REFERENCE TO RELATED APPLICATIONS

The following copending, commonly assigned patent applications, describe control operations used with the present invention and are hereby incorporated by reference.

1. "Enabling Mirror Nonmirror and Partial Mirror Cache Modes In A Dual Cache System" by Clark E. Lubbers, et al., Ser. No. 08/671,153, filed concurrently herewith.

2. "Controls For Dual Controller Dual Cache Memory System" by Clark E. Lubbers, et al., Ser. No. 08/668,512, filed concurrently herewith.

BACKGROUND OF THE INVENTION

1. Field of the Invention

The present invention relates to writing duplicate entries in separate cache locations simultaneously whereby cache entries are mirrored, or written twice, in one write cycle resulting in physically separate and independent copies of the data.

2. Description of Related Art

In storage systems of computing systems, the response time of the storage system is greatly enhanced by the use of cache memory. As is well known, a cache memory stores frequently accessed data word units in cache memory as well as in primary memory. Of course, the storage system must maintain data coherence between the word unit in cache and the same word unit in primary storage.

There are two strategies for maintaining word unit coherence—write-through cache and write-back cache. In a write-through cache, the processor writes the modified word unit to both the cache and primary memory to ensure that both memories always have updated copies of the word unit. This is the simplest and most commonly used method. In write-back cache, the cache controller keeps track of which word units in the cache have been modified by the processor. This is done by marking the modified word units with a dirty bit. Thereafter, when word units are displaced from the cache, the word units with a dirty bit are written to primary memory.

To increase the reliability of cache write-back storage, storage systems have written word units twice, once each at two separate cache memories. Accordingly, if one cache memory fails, the word unit is preserved in the second cache memory. This is referred to as mirror write.

Figure 1:
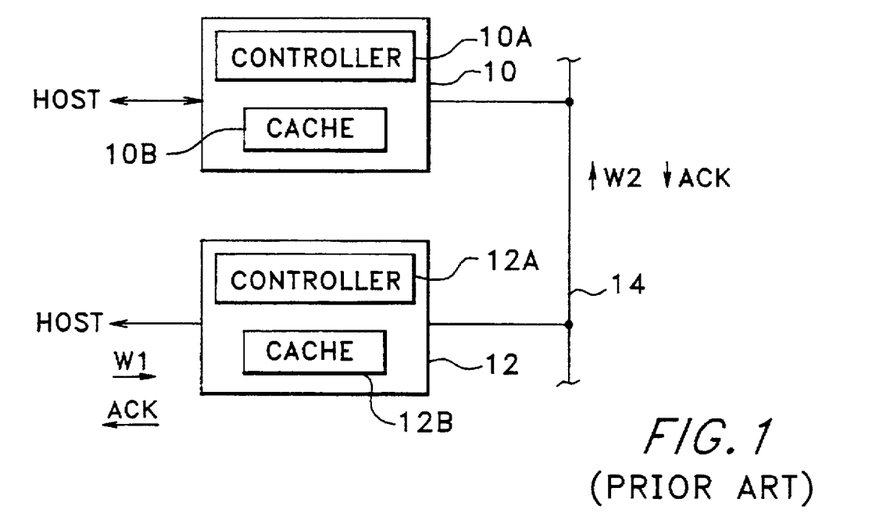
FIG. 1 shows a conventional mirror write cache system with two independent cache systems.

FIG. 1 shows an example of the conventional mirror write system. There are two separate cache systems each with their own controller. Cache system 10 contains controller 10A and cache 10B, while cache system 12 contains controller 12A and cache 12B. The cache systems are interconnected by bus 14.

There are two significant problems with the conventional cache system in FIG. 1. First, the mirror write operation is very slow. Second, if the cache in a first cache system fails, and the controller in the second cache system fails, then data in cache may be inaccessible if the controller in the first cache system can't get to the alternate good copy of the data in the cache of the second cache system.

A review of the mirror write operation in FIG. 1 illustrates how slow the operation is in the prior art. A mirror write in FIG. 1 begins with a write request to either cache system. Assume a mirror write request is received at cache system 12. Controller 12A writes the word unit into cache 12B. Controller 12A then reads the word unit to cache system 10 over bus 14. Controller 10A then writes the word unit to cache 10B. After the word unit is successfully written to cache 10B, controller 10A sends an acknowledge back to cache system 12. Cache system 12 receives the acknowledge and sends it back to the processor. Accordingly, the mirror write in the conventional system requires in sequence a write operation, a read operation, a second write operation, and two successive acknowledge operations. In addition, if bus 14 is shared with other storage devices in addition to the two cache systems, there may be a delay in communications between cache systems 10 and 12.

Note also that the mirror write has not solved the second problem of access to data if a controller in one cache system and a cache in the other cache system fails. For example, if controller 10A fails, data in cache 10B is not available. If cache 12B goes bad in this situation, the data is lost unless controller 12A can get to the data in cache 10B through a second cycle using bus 14.

SUMMARY OF THE INVENTION

In accordance with this invention, the above problems has been solved by a cache memory system in a computing system where the cache memory system has a first cache module storing data, a second cache module storing data, and a controller writing data simultaneously to both the first and second cache modules. A second controller can be added to also write data simultaneously to both the first and second cache modules. In a single write cycle each controller requests access to both of the first and second cache modules. Both cache modules send an acknowledgement of the cache request back to the controllers. Each controller in response to the acknowledgements from both of the cache modules simultaneously sends the same data to both cache modules. Both of the cache modules write the same data into cache in their respective cache modules.

In another feature of the invention a combination of the cache memories is split into quadrants, Q0, Q1, Q2 and Q3 with quadrants Q0 and Q1 in one cache memory and quadrants Q2 and Q3 in the other cache memory. One controller simultaneously writes the same data to both quadrants Q0 and Q3, and the other controller simultaneously writes the same data to both quadrants Q1 and Q2.

In another feature of the invention if one controller detects that the other controller has failed, the controller detecting failure of the other controller sends accesses to quadrants previously accessed by the failed controller.

The great advantage and utility of the present invention is the simultaneous mirror writing of the same data to two cache memories in a single write cycle. Another advantage is the reliability achieved with each of the controllers having access to both cache memories.

The foregoing and other features, utilities and advantages of the invention will be apparent from the following more particular description of a preferred embodiment of the invention as illustrated in the accompanying drawings.

DETAILED DESCRIPTION OF PREFERRED EMBODIMENTS

Figure 2:
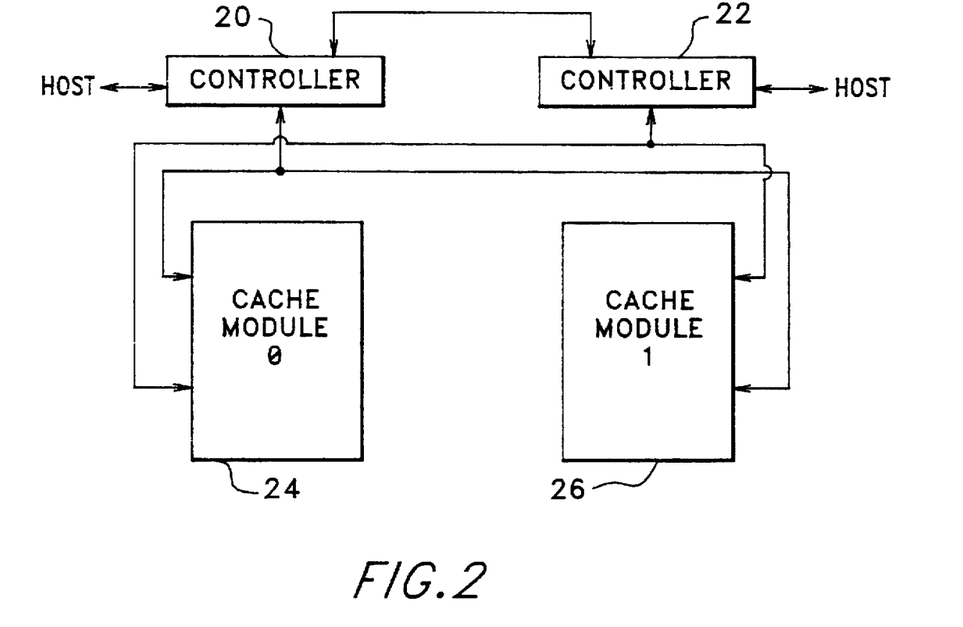
FIG. 2 illustrates a mirror write cache system with two interdependent cache systems in accordance with a preferred embodiment of the invention.

A preferred embodiment of two coordinated cache systems in accordance with the invention is shown in FIG. 2. The two cache memories, Cache Module 0 and Cache Module 1, are divided in half by addressing. Accordingly, the total cache memory may be viewed as four quadrants of cache, quadrants Q0 and Q1 are in cache Module 0 and quadrants Q2 and Q3 are in Cache Module 1. In an alternate embodiment the cache quadrants are not necessarily the same size.

The cache storage system has two controllers. Controller 20, writes word units simultaneously to quadrant Q0 of Cache Module 0 and quadrant Q3 of Cache Module 1. This write operation is not two successive writes, but is two simultaneous write operations in parallel, one to quadrant Q0 and the second to quadrant Q3. The same base address is used in both quadrants. Alternatively, address translation may be used to place the mirror data at different addresses in the mirror quadrants.

Likewise, whenever second controller 22 has data to write to cache, it simultaneously writes that data word unit to quadrant Q1 in Cache Module 0 and quadrant Q2 in Cache Module 1. Again, the mirror write operation of a single word unit to two separate cache memories is done as one write operation in parallel to two caches. This configuration of a cache storage system accomplishes a mirror cache write and writes the two word units several times faster than the conventional mirror write cache system in FIG. 1. This is due to the fact that there is only one write operation in contrast to the prior art where there was a write operation followed by a read operation followed by a write operation.

The second problem of controller redundancy is solved in the cache system configuration on FIG. 2. Controller 20 and controller 22 have the capability of writing and reading any of the quadrants in Cache Module 0 and Cache Module 1. Further, Controller 20 and controller 22 are communicating and know each other's status of operation. Thus, if controller 20 fails, controller 22 can still simultaneously write to two quadrants and read any word unit entry in any quadrant of the cache memories. Accordingly if a controller fails, the simultaneous mirror write function is still operational, and there is no combination of cache memory loss and controller loss that prevents reading of data from a remaining good cache quadrant.

Figure 3A:
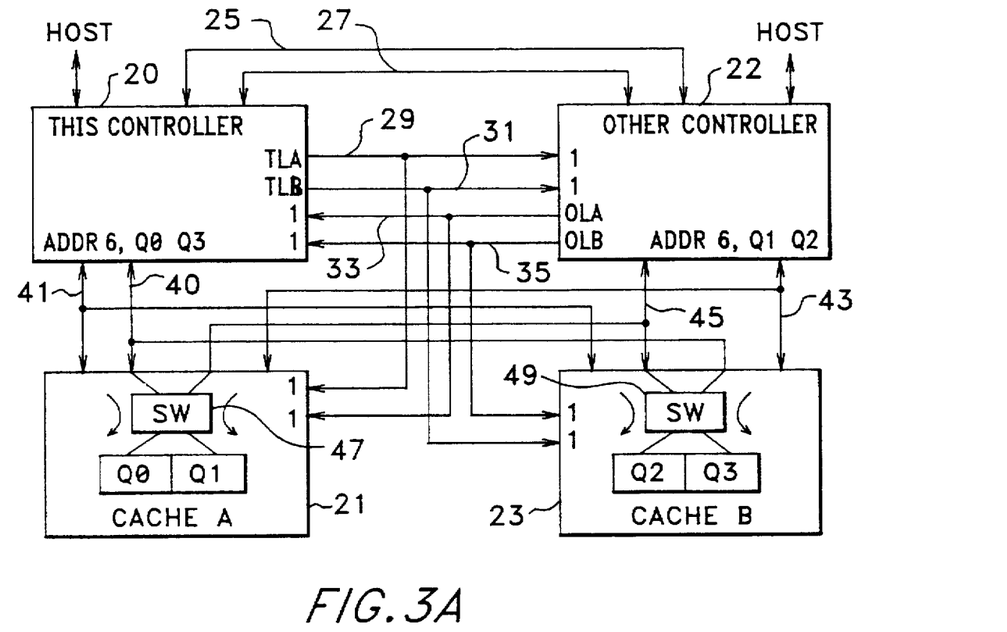
FIG. 3A shows a preferred embodiment of the invention in more detail illustrating the invention and signals used in the invention in a normal mirror write operation.

In FIG. 3A another preferred embodiment of the invention where the switching of the address data bus connection to the quadrants in the cache modules is done at the cache modules under control of signals from the controllers. FIG. 3A illustrates the normal mirrored write operation in accordance with this preferred embodiment of the invention. Controllers 20 and 22 and Cache A Module 21 and Cache B Module 23, along with the connections between each of these components are mirror images of each other. To help with the understanding of the operation of this dual controller cache system, controller 20 is referred to herein as "THIS" controller, and controller 22 is referred to as "OTHER" controller.

THIS controller 20 and OTHER controller 22 work with each other through a message link 25 and various control lines. Control Line 27 is a hard reset or kill line whereby either controller 20 or controller 22 may hard reset or kill the other controller. Control Lines 29, 31, 33 and 35 are lock lines that lock the operation of Cache A Module 21 and Cache B Module 23. Control Line 29 is the THIS Locks A (TLA) control line. This occurs when the signal on Control Line 29 is high, or in a binary 1 state. Similarly, Control Line 31 is the TLB line, i.e. THIS Locks B control line. Control Line 33 is the OLA, OTHER Locks A control line. Finally, Control Line 35 is the OLB or OTHER locks B control line. In a normal mirror write operation, all of these control lines 29, 31, 33 and 35 are high or in a binary 1 state as indicated in FIG. 3A.

There are also control lines between each of the controllers 20 and 22 and the Cache Modules 21 and 23. Control lines 41 pass requests, acknowledgement, read/write state and sync signals between THIS controller 20 and Cache A Module 21 and Cache B Module 23. Control lines 43 similarly pass request, acknowledge, read/write and sync signals between OTHER controller 22 and Cache A Module 21 and Cache B Module 23. Address data bus 40 passes the address and subsequently data words from THIS controller 20 to Cache A Module 21 and Cache B Module 23. Address data bus 45 similarly passes address and data words from OTHER controller 22 to Cache B Module 23 and Cache A Module 21.

In each of the Cache Modules, 21 and 23, there is a switch between the address/data buses 40 and 45 and the quadrants of the cache module. In Cache A Module 21, switch 47 directs address/data bus 40 to Quadrant Q0 and address/data bus 45 to Quadrant Q1. Switch 47 is controlled by the TLA 29 and OLA 33 lock signals. In the mirror write operation both of these lock signal s are high or in a binary 1 state.

Switch 49 in Cache B Module 23 is also in a mirror write condition due to the binary 1 inputs from the TLB and the OLB control Lines 31 and 35. Accordingly, switch 49 connects address/data bus 45 to Quadrant Q2 and connects address/data bus 40 to Quadrant Q3.

In the normal operation for a mirror write in FIG. 3A THIS controller 20 is writing simultaneously to Quadrant Q0 of Cache A Module 21 and to Q3 of Cache B Module 23. Similarly, OTHER controller 22 in a mirror write operation is writing to Quadrant 1 of Cache A Module 21 and to Quadrant 2 of Cache B Module 23. In both THIS controller 20 and OTHER controller 22, the highest order address hexadecimal digit for this write operation is pre-determined to be a 6. Accordingly, an address of 6XXX XXXX to either the THIS controller or the OTHER controller is a signal to perform a mirror write. In the case of THIS controller, the mirror write is to Quadrants Q0 and Q3; in the case of OTHER controller, the mirror write is to Quadrants Q1 and Q2.

Figure 3B:
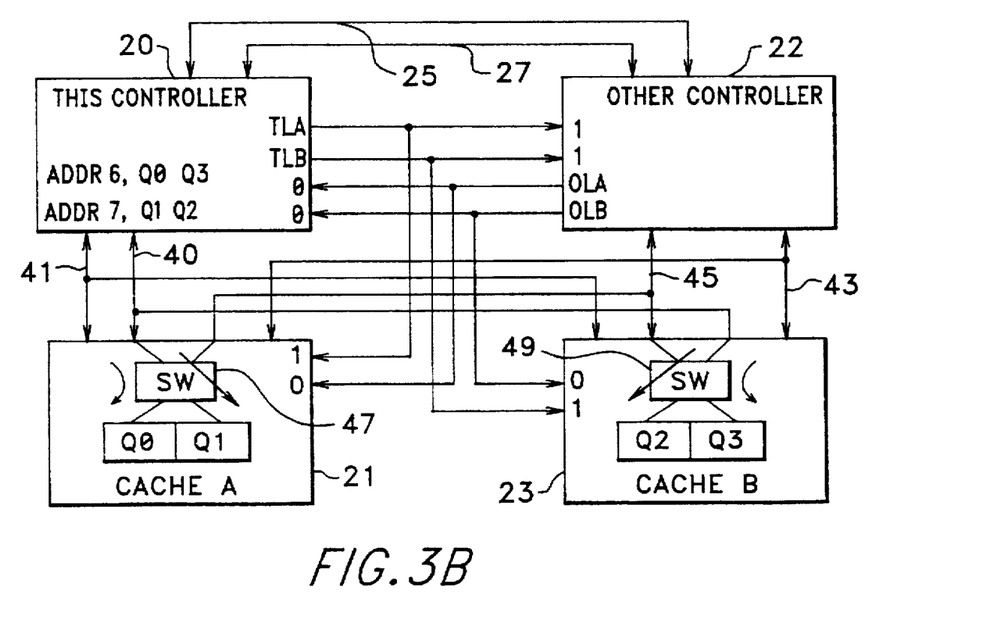
FIG. 3B shows the preferred embodiment of the invention illustrated in FIG. 3A with the signals used in a mirror write operation where one controller has failed.

In another feature of the preferred embodiment of the invention the invention can still perform mirror write operations even though one controller crashes. In FIG. 3B this fail-safe operation is illustrated where OTHER controller 22 has failed. THIS controller 20 and OTHER controller 22 carry on a keep-alive and status conversation over message link 25. For example, periodically THIS controller 20 will send a "keep alive" message over link 25 to OTHER controller 22. OTHER controller 22 will respond with a status message back across link 25 to THIS controller 20. If THIS controller 20 detects the absence of a status message back from OTHER controller 22, controller 20 assumes OTHER controller 22 is failing or has failed. THIS controller 20 then generates a kill or hard reset signal on line 27 to kill operations by OTHER controller 22.

When OTHER controller 22 is down either because it has crashed or because it has been killed by THIS controller 20, the OLA 33 and OLB 35 control signals will be low or at a binary 0 state because the kill signal has been asserted. With both OLA and OLB at binary 0, THIS controller 20 knows the OTHER controller 22 is off.

Each of the Cache Modules 21 and 23 will receive a binary 1 control signal from TLA and TLB respectively and a binary 0 signal from OLA and OLB respectively. This 1 and 0 condition added to the Cache Modules 21 and 23 will change the state of switches 47 and 49. When THIS controller 20 is using an address with a most significant digit being a 6 THIS controller will simultaneously write to Q0 through switch 47 and to Q3 through switch 49. When THIS controller 20 is using an address 7 for the most significant hexadecimal digit, THIS controller will simultaneously write to Q1 through switch 47 and to Q2 through switch 49. Notice that in both cases the address and data information for the cache modules comes over address data bus 40. Just as THIS controller 20 is able to do a mirror write if OTHER controller 22 fails, similarly, OTHER controller 22 can do a mirror write if THIS controller 20 fails. In such a situation, TLA and TLB would go low and OLA and OLB would go high. For a most significant digit 6 in the address at OTHER controller 22, bus 45 would be connected by switch 47 to quadrant Q1 and to Quadrant Q2 through switch 49. For an address 7 in the most significant digit position, OTHER controller 22 will route the data through bus 45 through switch 47 to Quadrant Q0 and through bus 45 through switch 49 to Quadrant Q3.

Figure 4:
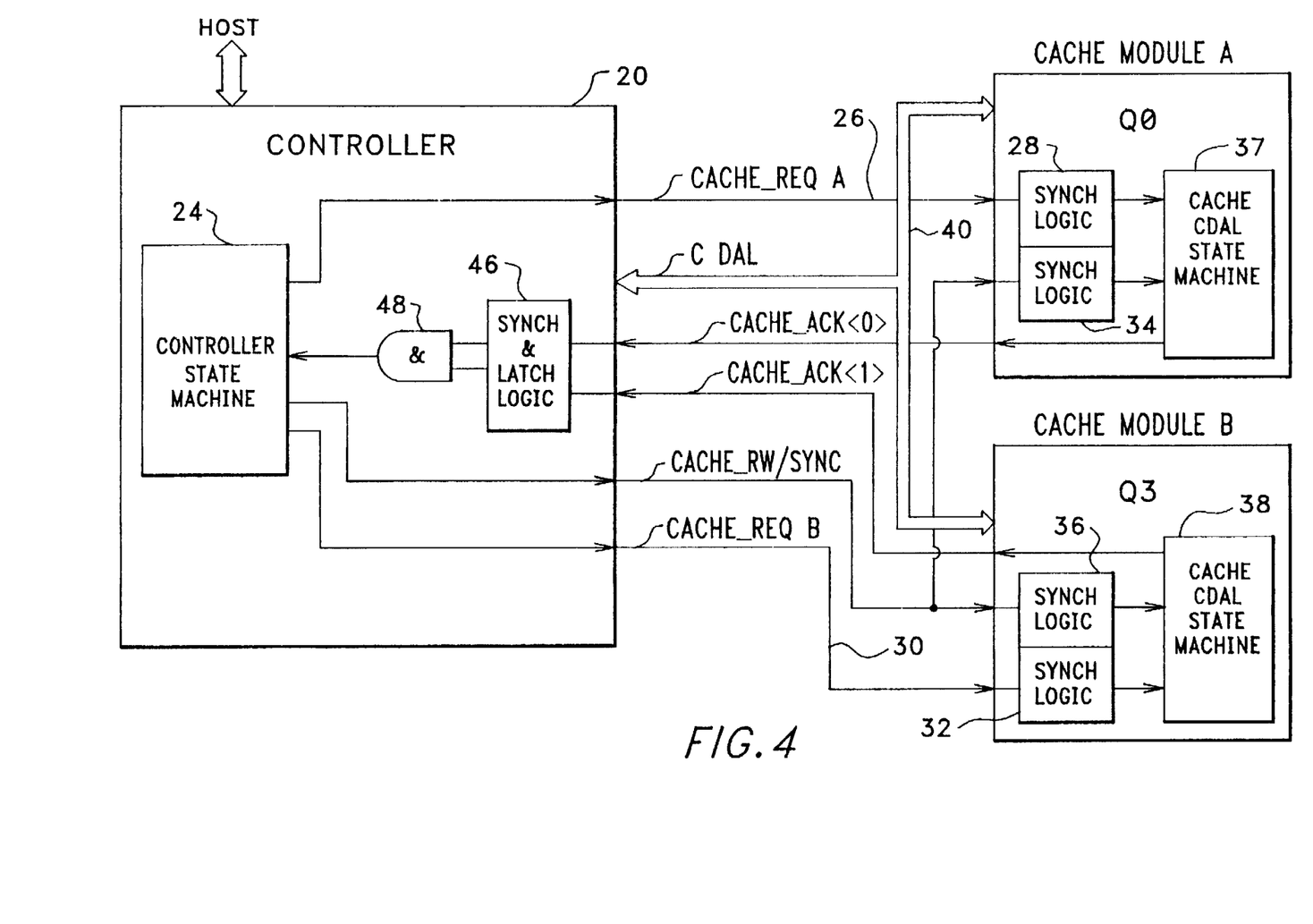
FIG. 4 shows in detail half of the mirror write cache system of FIG. 2.

FIG. 4 illustrates, in more detail, one-half of the cache system in FIG. 3A. In particular, controller 20 is illustrated along with quadrant Q0 of Cache A Module and quadrant Q3 in Cache B Module. Controller 22, working with quadrants Q1 and Q2 in Cache A and Cache B Modules respectively, would have the same elements as will now be described for controller 20 and cache quadrants Q0 and Q3.

The mirror write operation begins with the controller state machine 24 sending a CACHE_REQ (cache request) A signal over line 26 to sync logic 28 in CACHE A MODULE. At the same time, controller state machine 24 generates the CACHE_REQ B signal, which goes out over line 30 to sync logic 32 in CACHE B MODULE. The CACHE_REQ A and CACHE_REQ B are shown in the timing diagram illustrated in FIG. 5.

Figure 5:
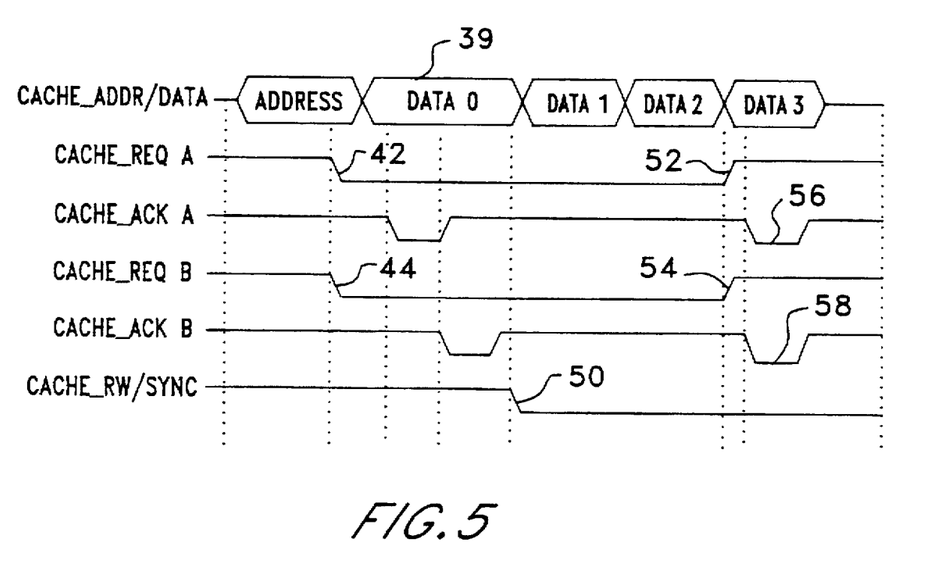
FIG. 5 is a signal timing diagram for signals in FIG. 4.

In FIG. 5 the top signal line is the cache address/data signal indicating the timing of address and data information on the CDAL (cache data/address line) bus 40 in FIG. 4. The CACHE_REQ A and CACHE_REQ B signals are represented by a transition from high to low on the signal lines correspondingly labeled in FIG. 5. These transitions occur during a time when the address is on the CDAL bus 40 in FIG. 4. Transition 42 of the CACHE_REQ A signal notifies CACHE A MODULE to read the address on bus 40. Likewise, transition 44 in CACHE_REQ B signal notifies CACHE B MODULE to read the cache address on bus 40.

The cache request transitions 42 and 44 also signal the cache modules to sample the state of the CACHE——RW/SYNC (cache read write/sync) signal in FIG. 5. The CACHE_RW/SYNC signal is high to indicate a write and low to indicate a read. As shown in the mirror write example in FIG. 5, the CACHE_RW/SYNC is high at the time of request transitions 42 and 44. Therefore, both cache A and B modules will know that data is to be written at the address just received.

In FIG. 4, as each cache state machine, 37 or 38, accepts the DATA 0 word unit 39 from CDAL bus 40, the cache state machine generates an acknowledgement signal, CACHE_ACK A or CACHE_ACK B. CACHE_ACK A goes back from cache state machine 37 to the sync and latch logic 46 in controller 20. CACHE_ACK B goes back from cache state machine 38 to the sync in latch logic 46 and controller 20.

As shown in FIG. 5, the CACHE_ACK A and CACHE_ACK B signals (negative-going pulses) are not necessarily generated at the same time. Once both CACHE_ACK signals are received at sync and latch logic 46 in controller 20, AND gate 48 will generate an output indicating both cache A and B modules have acknowledged receipt of the first word unit. This output goes to the controller state machine 24 which then drops or transitions the CACHE_RW/SYNC signal (FIG. 5) from high level to low level. This transition 50 of the CACHE_RW/SYNC signal in FIG. 5 is the sync signal passed from the controller state machine back to the cache state machines 37 and 38. This sync signal tells the cache state machines that DATA 1 word unit is now on the CDAL bus 40.

In the preferred embodiment, the data on the CDAL bus is in four data words, data 0, data 1, data 2 and data 3 as shown in FIG. 5. The data is received and written by the cache modules starting at the address just previously received over the CDAL bus and in sequential addresses after the starting address. At the time the controller places the last data word unit on the CDAL bus, the controller state machine raises the CACHE_REQ A and CACHE_REQ B signal back to the high level to indicate the end of the current write cycle. When these transitions, 52 and 54, occur on the CACHE_REQ A and B signals, the cache state machines are prompted to acknowledge that the last data is being received. Accordingly, a CACHE_ACK A pulse 56 and a CACHE_ACK B pulse 58 are sent back from the cache state machines to the controller 20 to acknowledge receipt of data.

Figure 6A:
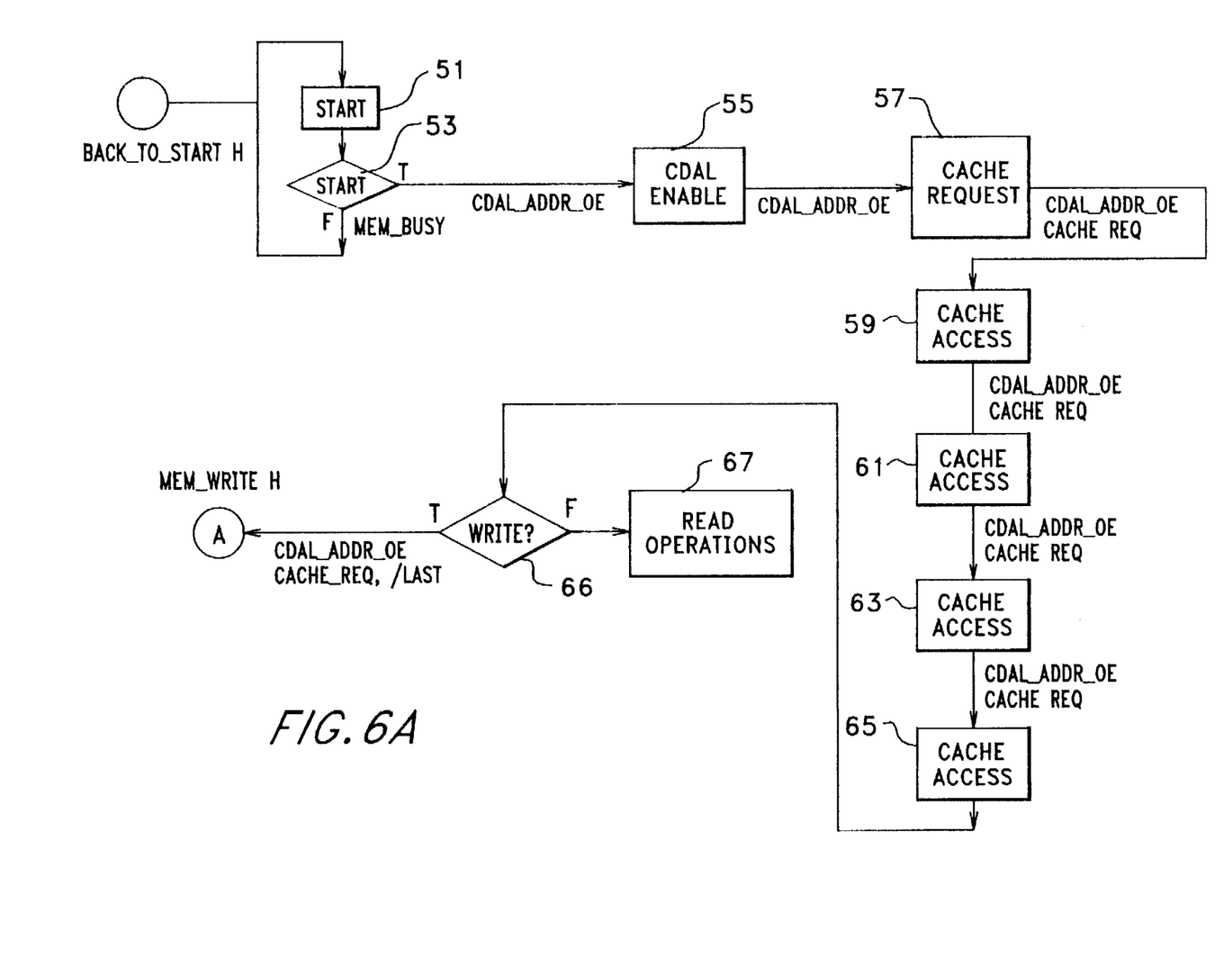
FIGS. 6A and 6B, are state flow diagrams illustrating the operation of the controller state machine in FIG. 4.
Figure 6B:
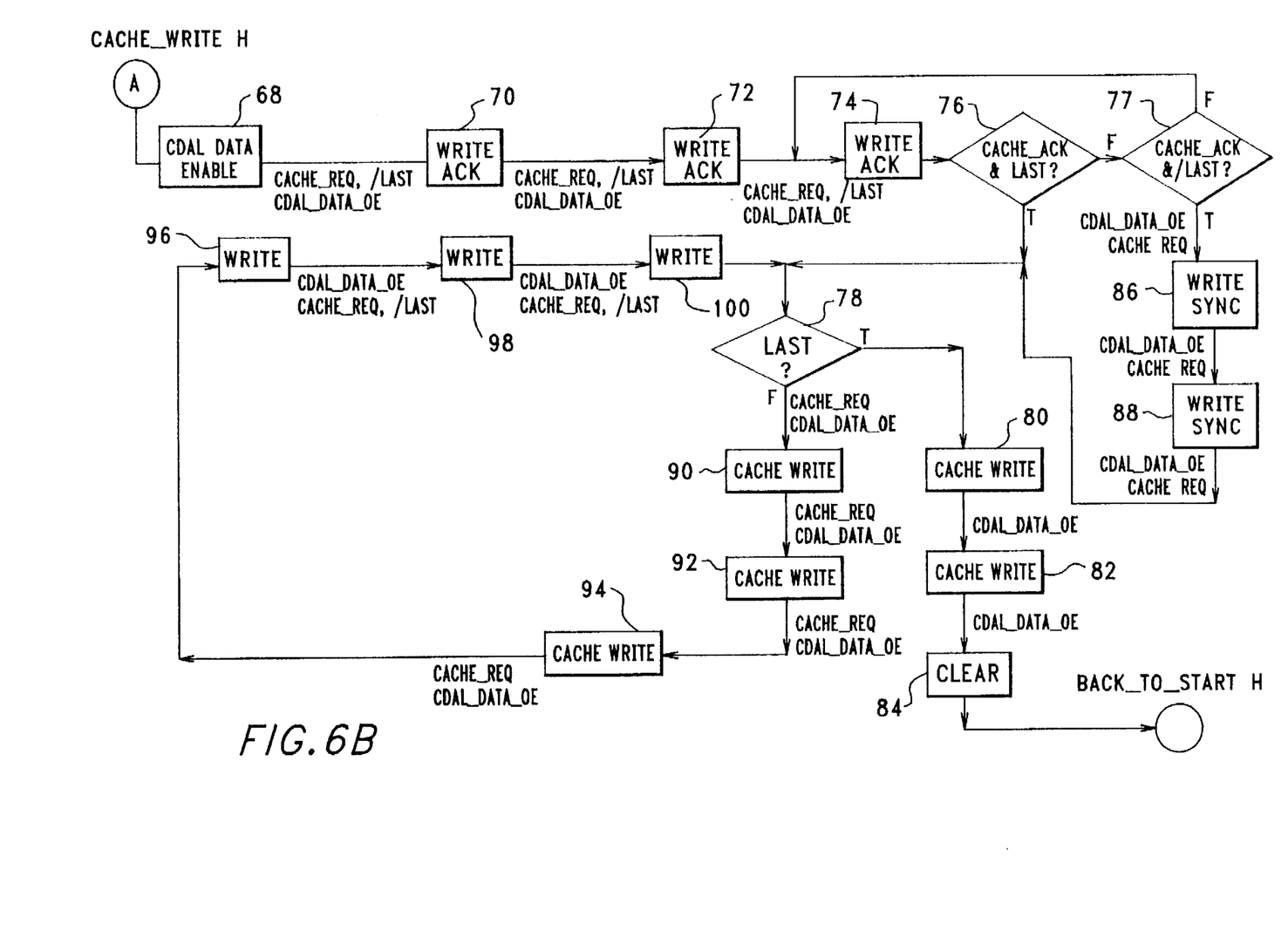

FIGS. 6A and 6B, illustrate the details of the controller state machine 24 of FIG. 4. In the state flow charts the state machine advances from state to state on each clock tick from the local clock in the controller. In addition some states have a decision operation to detect the presence of a condition before action is taken and an advance is made to the next state. The action taken is indicated at the output path of the state or the decision operation.

In FIG. 6A, start state 51 cooperates with start decision operation 53 to detect an access request. The access request is generated by the controller microprocessor in response to an access request from the host. At each clock tick, start state 51 causes decision operation 53 to test for an access request. If there is no access request, decision operation 53 indicates memory is busy, and the operation flow returns to start state 51. If there is an access request detected, decision operation 53 generates a CDAL_ADDR_OE (cache data/address line address enable) signal to put the address for the access request on the CDAL bus 40 (FIG. 4). The operation flow then passes to CDAL enable state 55 on the next clock tick.

CDAL enable state 55 keeps the CDAL_ADDR_OE enable signal asserted. On the next clock tick cache request state 57 generates the cache request signals (CACHE_REQ A and CACHE_REQ B in FIGS. 4 and 5). In other words the cache request signals go through a transition from high to low. Cache request state 57 also continues to assert the CDAL_ADDR_OE signal.

Cache access states 59, 61, 63 and 65 are advanced through in turn in the next successive four clock ticks. Each of these states maintains the CDAL_ADDR_OE enable signal and the CACHE_REQ signals. Cache access state 65 also has a decision operation 66 that tests whether the access request is a read or write request. If the request is a read request the operation flow branches to cache read operations 67 which are not a part of the present invention and not shown in detail. If the request is a write request, the CDAL_ADDR_OE signal and the CACHE REQ signal is generated. The continued assertion of CACHE REQ indicates there is a cache write request and the last word unit to be written in this write cycle has not been reached yet. The operation flow branches to CDAL DATA enable state 68 when the next clock tick occurs.

CDAL_DATA enable state 68 generates the CDAL DATA_OE signal to put data unit words on the CDAL bus 40 (FIG. 4). State 68 also maintains the cache request signals. For each clock tick after state 68 the controller state machine advances through write states 70, 72 and 74. Accordingly, for these three clock ticks these states maintain the CACHE_REQ signal and the CDAL_DATA_OE signal.

In state 74, decision operation 76 tests whether the controller has received back both CACHE_ACK A and B signals and whether the data word unit to be written is the last unit in this write cycle to be written. If both of these conditions are satisfied, this indicates that both cache modules have acknowledged the write request and that the controller is sending only one word unit to be written rather than a burst of four word units. If either of the conditions is not satisfied, the operation flow branches to decision operation 77. Decision operation 77 is testing for receipt of both CACHE_ACK A and B signals and the not last data word unit, i.e. both cache modules have replied and a burst of data word units is to be written. If both decision operation 76 and 77 branch false, then the CACHE_ACK signals must not been received by the controller. Accordingly, the operation flow branches false back to the input of write ack state 74.

The operation flow branches true from decision operation 76 to decision operation 78 when both CACHE ACKs have been received and only one data word unit has been written. Decision operation 78 tests whether the word unit to be written is not the last word unit to be written. Since decision operation 76 just indicated or detected that it was the last word unit to be written, the operation flow will branch false from decision operation 78 to state 80 while maintaining the CDAL data enable condition.

At the next two clock ticks cache write states 80 and 82 maintain the CDAL_DATA_OE signal. After state 82 and on the occurrence of the next clock tick, cache write state 84 clears the cache select and the cache request to prepare for the next access cycle. The operation flow then returns to the start state 50 in FIG. 6A.

The operation flow branches true from decision operation 77 to operation 86 when both CACHE_ACK signals have been received and a burst of four data word units is to be written. Write sync states 86 and 88 continue to maintain the CDAL_DATA_OE signal and the CACHE_REQ signal for the next two clock ticks. While in state 88 decision operation 78 is again used to check for the not last condition of the data word units being sent on the CDAL bus. If the controller indicates the data word unit is not the last to be written (burst operation), then the operation flow branches true from decision operation 78 and the operation maintains the CACHE_REQ signal the CDAL_DATA_OE signal and increments the burst counter. The burst counter will count the number of passes through the true state detection condition of decision operation 78 so as to detect when the last data word of a burst of data words in the write cycle has been placed on the CDAL bus 40. Thereafter at each clock tick the operation flow advances through cache write states 90, 92, 94, 96, 98, and 100 successively. Each of these cache write states maintains the CACHE_REQ signal and the CDAL_DATA_OE signal. Thus, for the next six clock ticks these conditions are maintained.

After state 100 the operation flow returns to decision operation 78 to check for the not last condition for data word units being transmitted over the CDAL bus during this write cycle. In the preferred embodiment of the invention, a burst includes four data word units. Accordingly, when the burst counter indicates the last data word has been put on to the CDAL bus by the controller decision operation 78 branches true to state 80. As described above, states 80, and 82 maintain the CDAL_DATA_OE signal while the controller outputs the last data word unit and then state 84 clears the cache selection and cache request in preparation for the next write cycle.

Figure 7A:
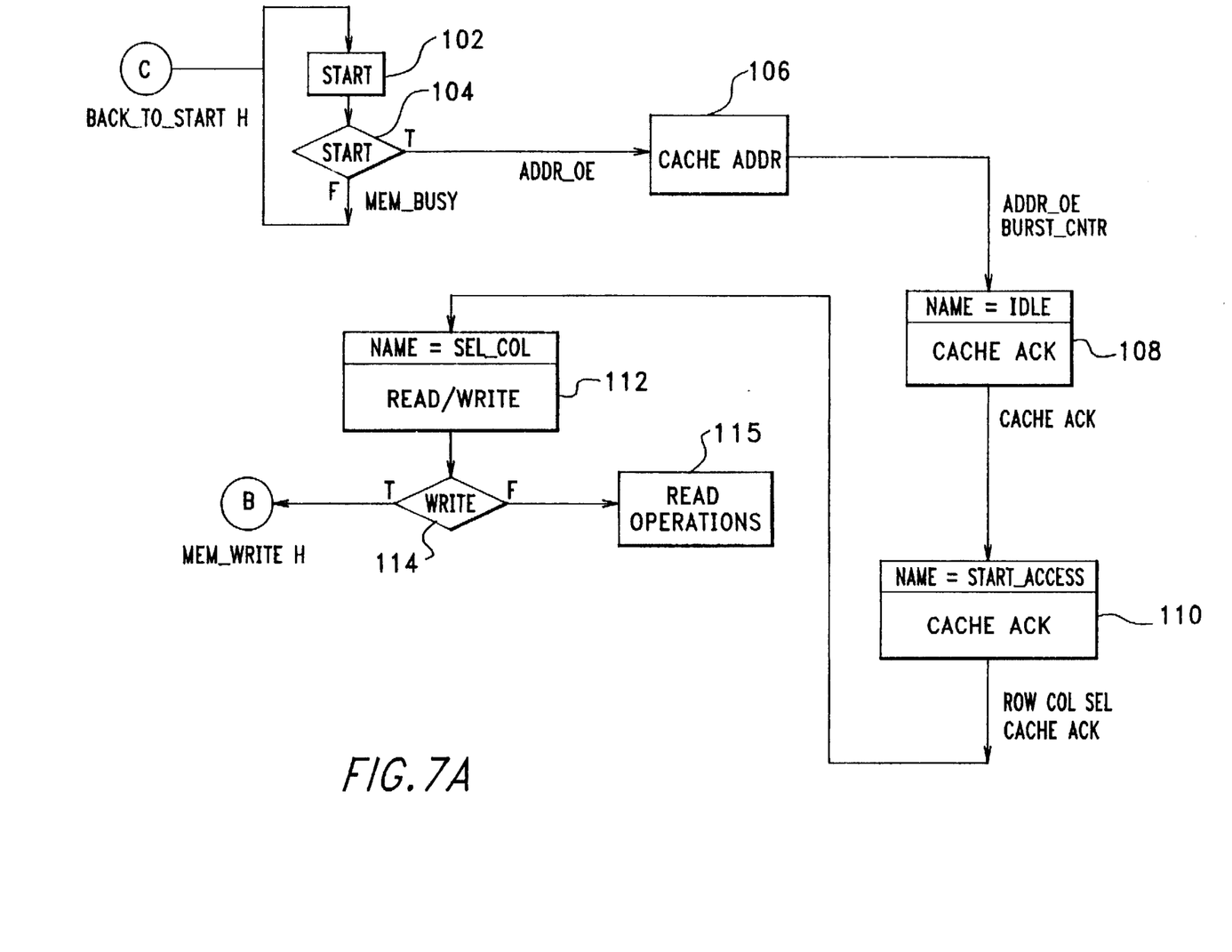
FIGS. 7A and 7B, are state flow diagrams illustrating the operation of the cache state machine in FIG. 4.
Figure 7B:
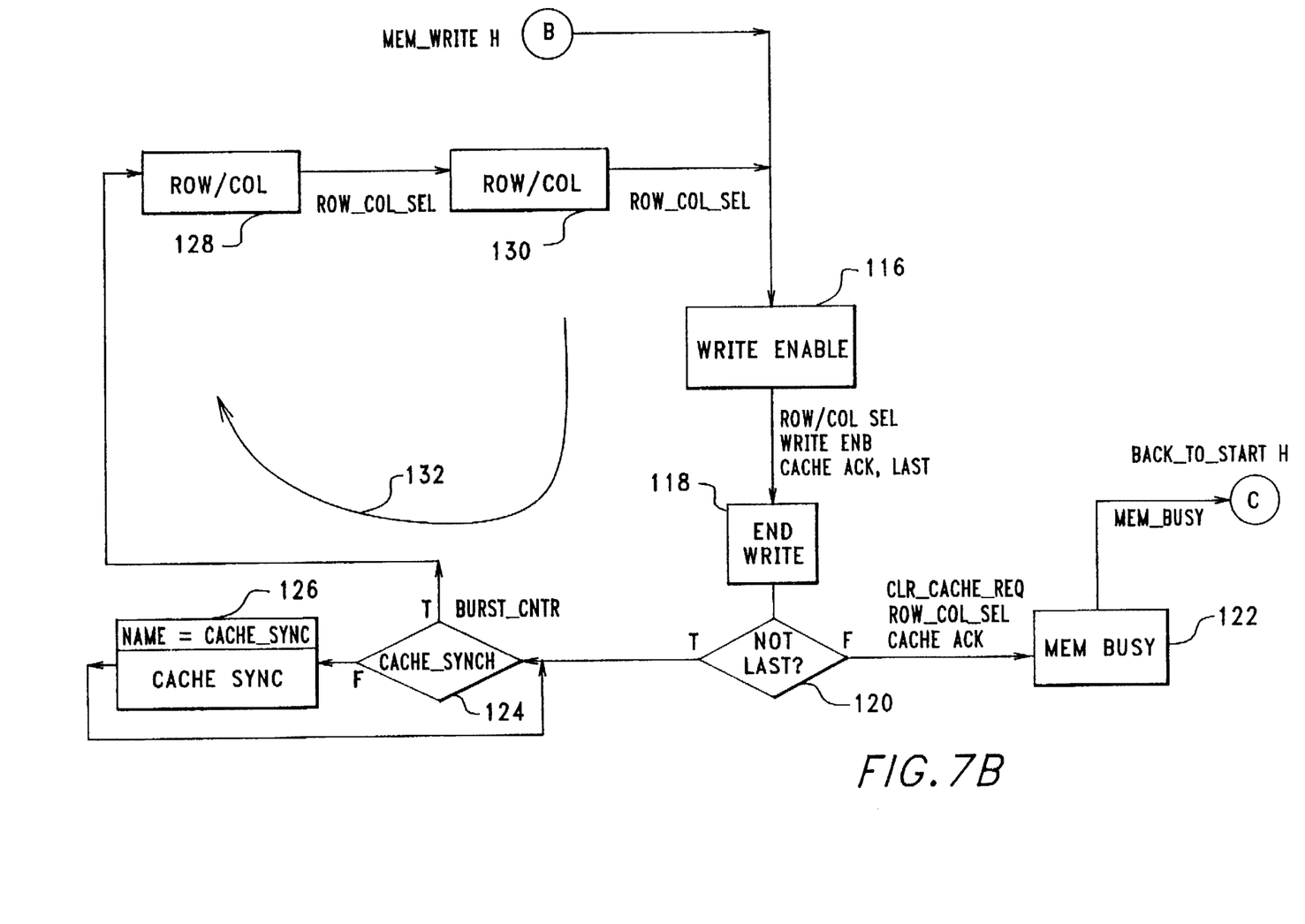

Cache state machine 37 or 38 in FIG. 4 is illustrated in detail in FIGS. 7A and 7B. In FIG. 7A, the operation of the cache state machine begins at start state 102. Start state 102 includes the start decision operation 104 and is effectively a wait state waiting for the receipt of a cache request from the controller. At each clock tick in the cache module, start decision operation 104 tests for the CACHE_REQ signal. When no CACHE_REQ signal is present, the operation branches false from decision operation 104 and stays in the start state 102. When the CACHE_REQ signal is present, start decision operation 104 branches true, and the address enable condition is initiated at the cache module.

On the next clock tick, cache address state 106 continues to maintain the address enable condition in the cache module. Also state 106 increments the burst counter to count the first data word to be processed in this access request cycle.

On the next clock tick, cache ack (cache acknowledge) state 108 initiates the CACHE_ACK signal to be passed back from the cache module to the controller. This confirms that the cache module has received the access request and the cache address.

The CACHE_ACK signal is maintained for another clock tick by state 110. State 110 also enables the ROW COL SEL (row and column select) condition to enable the address to select the storage location in the cache module. On the next clock tick, state 112, the read/write decision state, includes decision operation 114. Operation 114 tests whether the access request is a write request. If the request is a read request, the operation flow branches false from decision operation 114 to read operations 115. The read operations are not described herein. However, note that invention permits reading of either copy of the mirror written data.

If the access request is a write request, the operation flow branches true from write decision operation 114 to write enable state 116 in FIG. 7B. Write enable state 116 is entered on the next clock tick. Notice that the read/write test state 112 did not maintain the CACHE_ACK signal, and the CACHE_ACK signal transmitted back to the controller is ended.

In FIG. 7B, the write enable state 116 maintains the ROW COL SEL condition and enables the writing of the data word unit from the CDAL bus to the memory address location in the cache chosen to receive by the cache module. In addition, the write enable state detects whether this is the last data word unit to be written in this write cycle. Write enable state 116 enables the CACHE_ACK signal if the data word is the last data word unit to be written in the cycle. If the write cycle is not for a single data word, then CACHE_ACK is not enabled by state 116. End write state 118 has a decision operation 120 to detect the not last data word unit condition. If it is the last data word unit to be written, the operation branches false from decision operation 120. On the false condition from operation 120, state 118 maintains the ROW COL SEL condition to finish the writing of the word, enables the CACHE_ACK signal to indicate to the controller that the last data word unit is being written, clears the cache request from the cache module so that the module is ready to handle the next cache request. On the next clock tick, memory busy state 122 raises a memory busy condition and returns the operation flow back to start state 102 in FIG. 7A to await the next cache request.

If the data word unit being written in cache is not the last data word unit in the burst of data word units in the write cycle, then the operation flow branches true from decision operation 120. Decision operation 124 then tests whether a CACHE SYNCH signal is present or being received from the controller. Since there are two separate cache state machines, one in each cache module, it is necessary to sync the cache state machines with the CACHE_RW/SYNCH signal transition 50 (FIG. 5). If there is no CACHE SYNCH signal, the operation flow branches false from decision operation 124 to state 126. The cache state machine will remain in state 126 until the CACHE SYNCH signal is detected when a clock tick advances the states in the state machine. The CACHE SYNCH signal will be received at the same time by both cache state machines. Accordingly after state 126, the cache modules proceed in sync.

When the CACHE SYNCH signal is detected, the operation flow branches true from CACHE SYNCH decision operation 124. In this event, the burst counter is incremented, and the row column select condition is raised to select the address location in the cache for the data to be written. States 128 and 130 maintain the ROW COL SEL condition for two more clock ticks. On the third clock tick the operation flow returns to state 116 where the ROW COL SEL condition is maintained while the data for the data word unit is written by the write enable state 116. The operation flow in the cache state machine remains in loop 132 until the last word unit in the burst of word units to be written has been written. At that time, the write enable state 116 will raise the CACHE_ACK signal, decision operation 120 will branch false enabling the CACHE_ACK signal for the controller, and then state 122 memory busy will drop the CACHE_ACK signal and raise the memory busy signal. This will return the operation flow back to start state 102 in FIG. 7A.

In the manner described above, the controller will talk to the cache modules, and the cache modules will respond whereby the data in the write cycle will be mirror written to the appropriate quadrant in cache A module and cache B module.

While the invention has been particularly shown and described with reference to preferred embodiments thereof, it will be understood by those skilled in the art that various changes in the form and details may be made therein without departing from the spirit and scope of the invention.

What is claimed is:

1. A method for simultaneously mirror-writing a same data in one write cycle into two separate cache memories in a cache memory system having a controller and two cache modules, each cache module having a cache memory, said method comprising the steps of:

requesting cache access to both cache modules from the controller;

acknowledging cache access to said cache modules by sending a CACHE ACK signal from each cache module back to said controller indicating a first word of the same data is being written;

simultaneously writing further words of the same data from the controller to cache memory in both cache modules in response to receipt of both CACHE ACK signals.

2. The method of claim 1 said writing step comprises the steps of:

sending a CACHE SYNC signal from the controller to both cache modules in response to receipt of both CACHE ACK signals from the cache modules; and simultaneously writing the further words of the same data from the controller to cache memory in both cache modules in response to receipt of the CACHE SYNC signal.

3. Apparatus for mirror writing data in a single write cycle in a memory cache system in a computer, the computer having a processor, said apparatus comprising:

a first cache module storing data;

a second cache module storing data;

a first controller;

said first controller requesting access to both of said first and second cache modules;

said first controller simultaneously sending a same data to both said first and second cache modules;

both of said first and second cache modules writing the same data into cache in their respective cache modules;

said first cache module sending an acknowledgment back to said first controller indicating data is being written;

said second cache module sending an acknowledgment back to said first controller indicating data is being written; and said first controller, in response to the acknowledgments from said first and second cache modules, sending further data to both the first and second cache modules.

4. The apparatus of claim 3 and in addition a second controller requesting access to both of said first and second cache modules;

said second controller simultaneously sending an other same data to both said first and second cache modules;

both of said first and second cache modules writing the other same data into cache in their respective cache modules;

said first cache module sending an acknowledgment back to said second controller indicating data is being written;

said second cache module sending an acknowledgment back to said second controller indicating data is being written; and said second controller, in response to the acknowledgments from said first and second cache modules, sending further other data to both the first and second cache modules.

5. The apparatus of claim 4 and in addition:

said first cache module and said second cache module have a first cache memory and a second cache memory, respectively;

a combination of said first and second cache memories is split into quadrants, Q0, Q1, Q2 and Q3 with quadrants Q0 and Q1 in said first cache memory and quadrants Q2 and Q3 in said second cache memory;

said first controller simultaneously writing the same data to both quadrants Q0 and Q3; and said second controller simultaneously writing the other same data to both quadrants Q1 and Q2.

6. The apparatus of claim 5 and in addition:

said first controller detecting that said second controller has failed;

said first controller in response to detecting failure of the second controller sending cache requests for quadrants Q1 and Q2 to access quadrants previously accessed by said second controller.

7. A method for simultaneously mirror-writing in a cache memory system comprising a first controller, a second controller, a first cache module and a second cache module, each cache module comprising a cache memory, by simultaneously writing a first data and a second data to both of the cache memories, said method comprising the steps of:

generating separate request signals for cache memory access to said first and second cache modules from said first and second controllers;

acknowledging cache access to said cache module by sending separate acknowledgment signals from each of the said first and second cache modules to said first and second controllers indicating a first word of said first data is being written from the first controller to cache memory in the first cache module and said second cache module and a first word of said second data from said second controller to cache memory in said first cache module and said second cache module;

simultaneously writing further words of said first data from the first controller to cache memory in the first cache module and said second cache module and further words of said second data from said second controller to cache memory in said first cache module and said second cache module in response to receipt of said separate acknowledgment signals from said first cache module and said second cache module.

8. The method of claim 7 wherein said writing step comprises the steps of:

sending a CACHE SYNCH signal from the first controller and another CACHE SYNCH signal from the second controller to the first cache module and the second cache module in response to receipt of each of the CACHE ACK signals from the first cache module and the second cache module;

simultaneously writing said further words of said first data from the first controller to cache memory in the first cache module and the second cache module and said further words of said second data from said second controller to cache memory in said first cache module and said second cache module in response to receipt of the CACHE SYNCH signals.

9. The method of claim 8 wherein both cache memories are together split into quadrants, Q0, Q1, Q2 and Q3 with quadrants Q0 and Q1 in one of the cache modules and quadrants Q2 and Q3 in the other cache module and the method further comprising the steps of:

simultaneously writing the first data to both quadrants Q0 and Q3 from the first controller; and simultaneously writing the second data to both quadrants Q1 and Q2 from the second controller.

10. The method of claim 9 and in addition:

detecting said first controller has failed;

sending cache requests from said second controller to access quadrants previously accessed by said first controller detected as failed by said detecting step.

* * * * *